United States Patent  
Wakaki (10) Patent No.: US 11,290,062 B2  
(45) Date of Patent: Mar. 29, 2022

(54) AMPLIFIER CIRCUIT

(71) Applicant: Murata Manufacturing Co., Ltd., Kyoto (JP)

(72) Inventor: Ken Wakaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 31 days.

(21) Appl. No.: 16/783,423

(22) Filed: Feb. 6, 2020

(65) Prior Publication Data

US 2020/0177134 A1 Jun. 4, 2020

Related U.S. Application Data

(63) Continuation of application No. PCT/JP2018/027077, filed on Jul. 19, 2018.

(30) Foreign Application Priority Data

Aug. 10, 2017 (JP) .............................. JP2017-156172

(51) Int. Cl.
  *H03F 1/34* (2006.01)
  *H03F 1/22* (2006.01)
  *H03F 3/45* (2006.01)

(52) U.S. Cl.
  CPC ......... *H03F 1/223* (2013.01); *H03F 3/45659* (2013.01); *H03F 2200/294* (2013.01)

(58) Field of Classification Search
  CPC .. H03F 1/22; H03F 1/223; H03G 3/30; H03G 3/3026
  USPC ..................................... 330/86, 282, 311, 84
  See application file for complete search history.

(56) References Cited

U.S. PATENT DOCUMENTS

| 6,028,487 | A | 2/2000 | Kakuta et al. |
| 6,147,559 | A | 11/2000 | Fong |
| 8,102,214 | B2* | 1/2012 | Park .......................... H03F 3/19 330/291 |
| 2011/0221531 | A1 | 9/2011 | Kim et al. |
| 2015/0381126 | A1* | 12/2015 | Wu ........................... H03F 1/02 330/282 |

(Continued)

FOREIGN PATENT DOCUMENTS

| JP | H10-107552 A | 4/1998 |
| JP | 2000-059148 A | 2/2000 |
| JP | 2001-094357 A | 4/2001 |

(Continued)

OTHER PUBLICATIONS

International Search Report for International Application No. PCT/JP2018/027077 dated Aug. 21, 2018.

(Continued)

*Primary Examiner* — Steven J Mottola  
(74) *Attorney, Agent, or Firm* — Pearne & Gordon LLP (57) ABSTRACT

An amplifier circuit includes a first transistor including a signal input portion into which a signal is input from the outside, and a load inductor connected between the first transistor and a power supply line. In addition, the amplifier circuit includes a feedback circuit, which is connected between any position between the load inductor and the first transistor and the signal input portion of the first transistor. The gain and linearity are determined as appropriate in accordance with the amount of feedback from this feedback circuit.

16 Claims, 8 Drawing Sheets

(56) References Cited

U.S. PATENT DOCUMENTS

2018/0026592 A1* 1/2018 Wallis ................ H04B 1/1607
                                                    330/302

FOREIGN PATENT DOCUMENTS

| JP | 2008-098771 A | 4/2008 |
| JP | 2011-023841 A | 2/2011 |
| JP | 2012-099914 A | 5/2012 |
| JP | 2013-236410 A | 11/2013 |
| WO | 2010/082235 A1 | 7/2010 |

OTHER PUBLICATIONS

Written Opinion for International Application No. PCT/JP2018/027077 dated Aug. 21, 2018.

* cited by examiner

AMPLIFIER CIRCUIT

This is a continuation of International Application No. PCT/JP2018/027077 filed on Jul. 19, 2018 which claims priority from Japanese Patent Application No. 2017-156172 filed on Aug. 10, 2017. The contents of these applications are incorporated herein by reference in their entireties.

BACKGROUND

Technical Field

The present disclosure relates to, for example, a low noise amplifier circuit and more particularly to an amplifier circuit including a feedback circuit.

An amplifier circuit in which a feedback circuit is connected between an input end and an output end of a transistor including a signal input portion into which a signal is input from the outside is, for example, described in Patent Document 1.

Patent Document 1: Japanese Unexamined Patent Application Publication No. 2000-59148

BRIEF SUMMARY

In the amplifier circuit described in Patent Document 1, characteristics regarding the gain and linearity cannot be changed through switching in accordance with its use state.

The present disclosure provides an amplifier circuit that can switch between a high-gain mode and a high-linearity mode in accordance with a use state by performing switching in a feedback circuit.

(1) An amplifier circuit according to the present disclosure includes a first transistor having an input into which a signal is supplied, a load circuit that is connected between the first transistor and a power supply line, and a feedback circuit that is connected at a first node between the load circuit and the first transistor, and at a second node to the input of the first transistor, and the feedback circuit has a variable impedance and comprises a plurality of passive elements and at least one switch configured to selectively connect at least one of the plurality of passive elements, the plurality of passive elements comprising a resistor, a capacitor, or an inductor.

Due to the configuration above, the amount of feedback can be determined in accordance with the state of the switch, and thus switching between the high-gain mode and the high-linearity mode is performed in accordance with a use state.

(2) The feedback circuit can comprise a plurality of switches. Consequently, the amount of feedback can be determined in multiple stages in accordance with the state of the plurality of switches, and thus switching between the mode for a certain gain and the mode for a certain degree of linearity is possible in the multiple stages.

(3) The amplifier circuit further can include at least one second transistor cascode-connected between the load circuit and the first transistor. With this configuration, an amplifier circuit is configured that achieves low current consumption and a high gain.

(4) The feedback circuit, the first transistor, and the at least one second transistor can be constituted on a single die. Consequently, the amplifier circuit with the feedback circuit is completed on the single die, and thus the amplifier circuit can be miniaturized.

(5) The feedback circuit is connected, for example, at a plurality of nodes between the load circuit and the first transistor. With this configuration, the degree of linearity can be adjusted (set) in accordance with a selective feedback circuit connection. For example, the degree of linearity can be adjusted stepwise.

(6) A plurality of first transistors may be connected in parallel. With this configuration, too, switching between the high-gain mode and the high-linearity mode is possible in accordance with a use state.

(7) The plurality of first transistor can be connected in parallel, and a plurality of feedback circuits, each feedback circuit being connected to a different one of the plurality of first transistors. With this configuration, too, switching between the high-gain mode and the high-linearity mode is possible in accordance with a use state.

(8) The amplifier circuit may have a configuration in which at least one of the plurality of first transistors is not connected to one of the plurality of feedback circuits.

(9) The first transistor is constituted by a transistor circuit in which the plurality of first transistors are connected in parallel, and further includes a bias circuit configured to selectively supply a bias voltage to the plurality of first transistors.

With the configuration above, the effective transistor size of the transistor circuit is changed by selectively applying the bias voltage to the plurality of transistors, and thus setting ranges for the gain and linearity characteristics can be increased.

(10) The plurality of first transistors can include transistors having different gate widths. Consequently, the effective size of the first transistor circuit MM1 can be set in a multilevel manner with a small number of transistors, and the setting ranges for the gain and linearity characteristics can be easily increased.

According to the present disclosure, an amplifier circuit is obtained that can switch between the high-gain mode and the high-linearity mode in accordance with a use state.

DETAILED DESCRIPTION

Hereinafter, a plurality of embodiments for executing the present disclosure will be illustrated using some specific examples with reference to the drawings. The same portions in the drawings are denoted by the same reference numerals.

For convenience' sake, the embodiments are separately described by taking ease of description or understanding of main points into consideration; however, the configurations of different embodiments may be partially replaced with each other or combined. In second and subsequent embodiments, the description of things common to a first embodiment is omitted and only the points that differ from those of the first embodiment will be described. In particular, substantially the same operational effects due to substantially the same configuration will not be mentioned in every embodiment.

First Embodiment

Figure 1:
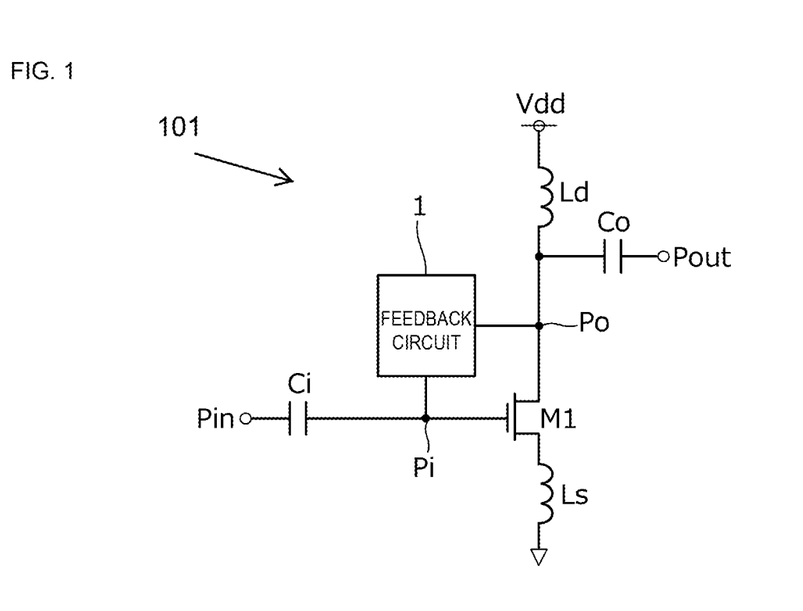
FIG. 1 is a circuit diagram of an amplifier circuit 101 according to a first embodiment.

FIG. 1 is a circuit diagram of an amplifier circuit 101 according to the first embodiment. This amplifier circuit 101 is an amplifier circuit including a first transistor M1, which includes a signal input portion Pi into which a signal is input from the outside, and a load inductor Ld, which is connected between this first transistor M1 and a power supply line Vdd. This amplifier circuit 101 is used as, for example, a front end low noise amplifier circuit (LNA) of a receiving circuit that performs cellular telecommunications.

The first transistor M1 is an n-channel metal oxide semiconductor field-effect transistor (MOS-FET). An inductor (feedback inductor) Ls is connected between the source of this first transistor M1 and the ground.

In the present embodiment, the load inductor Ld corresponds to "load circuit" in the present disclosure. A feedback circuit 1 is connected between a connection portion Po (the drain of the first transistor M1) between this load inductor Ld and the first transistor M1 and the signal input portion Pi of the first transistor M1 (the gate of the first transistor M1).

A capacitor Ci is connected between a signal input end Pin of the amplifier circuit 101 and the gate of the first transistor M1. In addition, a capacitor Co is connected between a signal output end Pout of the amplifier circuit 101 and the connection portion Po.

The amplifier circuit 101 operates as a common-source amplifier circuit. In this example, since the inductor Ls is connected between the source of the first transistor M1 and the ground, a source negative feedback circuit is configured.

FIGS. 2A-2D are circuit diagrams illustrating examples of a circuit configuration of the feedback circuit 1.

Figure 2A:
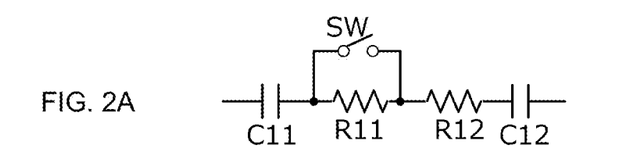
FIGS. 2A-2D are circuit diagrams illustrating examples of a circuit configuration of a feedback circuit 1.
Figure 2B:
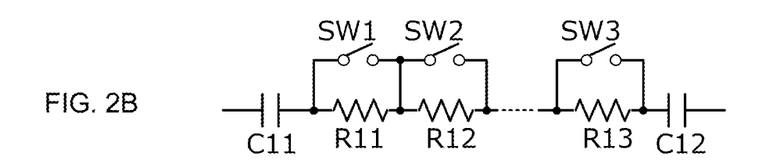
Figure 2C:
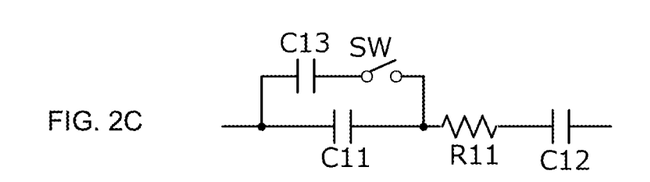
Figure 2D:
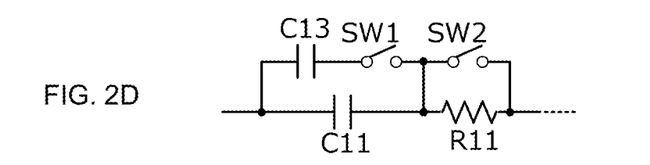

In the example illustrated in FIG. 2A, there are provided a series circuit and a switch SW. The series circuit includes capacitors C11 and C12 and resistors R11 and R12, and the switch SW bypasses both ends of the resistor R11. In the example illustrated in FIG. 2B, there are provided a series circuit and switches SW1, SW2, and SW3. The series circuit includes the capacitors C11 and C12, the resistors R11 and R12, and a resistor R13, and the switches SW1, SW2, and SW3 bypass both ends of the respective resistors R11, R12, and R13. In the example illustrated in FIG. 2C, there are provided a series circuit and a capacitor C13. The series circuit includes the capacitors C11 and C12 and the resistor R11, and the capacitor C13 is connected in parallel to the capacitor C11 with the switch SW interposed therebetween. In the example illustrated in FIG. 2D, there are provided a series circuit, the capacitor C13, and the switch SW2. The series circuit includes the capacitor C11 and the resistor R11, the capacitor C13 is connected in parallel to the capacitor C11 with the switch SW1 interposed therebetween, and the switch SW2 bypasses the resistor R11.

In any of the examples of FIGS. 2A-2D, the switches are semiconductor switches such as a transistor and a diode. In these examples, the feedback circuit is constituted by a CR circuit. The amount of feedback and its frequency characteristics are determined by a CR time constant. In addition, the amount of feedback is increased by turning each switch described above is on. That is, each switch described above is a switch for switching between connection states of a plurality of passive elements. In other words, each switch described above is configured to selectively connect at least one of the plurality of passive elements. The amount of feedback from the feedback circuit 1 can be adjusted in accordance with the connection state of the plurality of passive elements obtained as a result of switching performed by the individual switches described above. Note that it is sufficient that each switch described above be a switch for performing switching as to whether to bypass at least one of a plurality of passive elements included in the feedback circuit 1, and the switch does not always have to bypass a plurality of passive elements. In addition, it is sufficient that the number of switches included in the feedback circuit 1 be at least one, and the number of switches may be two or more as illustrated in, for example, FIGS. 2B and 2D. A circuit configuration of the feedback circuit 1 is not limited to those illustrated in FIGS. 2A-2D, and various modifications are conceivable. In addition, the feedback circuit 1 may include not only the resistors and the capacitors but also an inductor. Note that it is important that one or more capacitors operate as an element for blocking direct current such that a direct current component does not flow.

With the above-described configuration, the feedback circuit 1 is connected between the connection portion (first node) Po between the load inductor Ld and the first transistor M1 and at a second node to the signal input portion (input) Pi of the first transistor M1. That is, a feedback path is configured without necessarily using an impedance matching circuit of an input-output portion of the amplifier circuit, and thus the feedback circuit 1 can be simply configured. In addition, the amount of feedback can be determined in accordance with the state of the switches of the feedback circuit 1, and consequently a predetermined gain and a predetermined degree of linearity are obtained. In other words, in a case where an input signal is small and the gain is more necessary than the linearity, the amount of feedback from the feedback circuit 1 is reduced, and in a case where an input signal is large and the linearity is more necessary than the gain, the amount of feedback from the feedback circuit 1 is increased.

Second Embodiment

Figure 3:
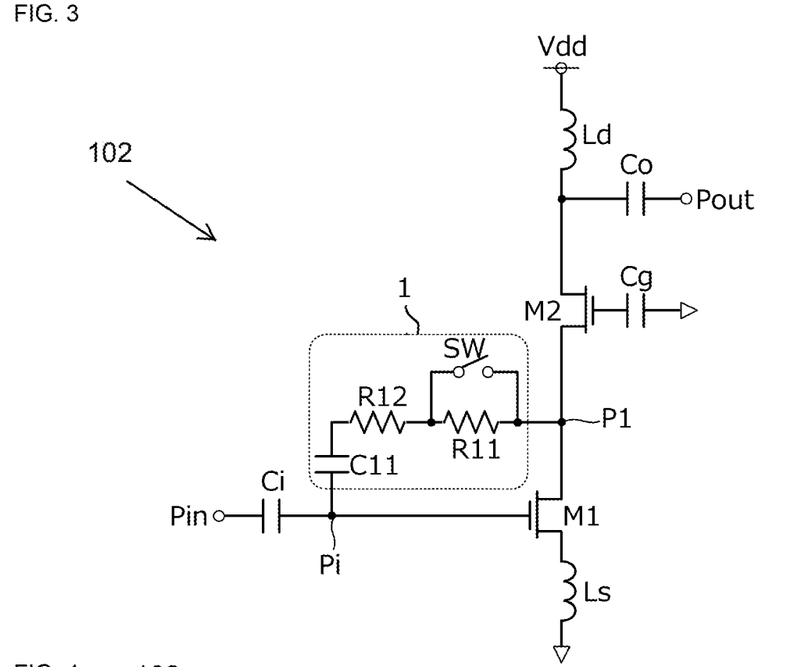
FIG. 3 is a circuit diagram of an amplifier circuit 102 according to a second embodiment.

In the second embodiment, an example is illustrated in which the present disclosure is applied to a cascode amplifier circuit. FIG. 3 is a circuit diagram of an amplifier circuit 102 according to the second embodiment. This amplifier circuit 102 is a cascode amplifier circuit including the first transistor M1, which includes the signal input portion Pi into which a signal is input from the outside, the load inductor Ld, which is connected between this first transistor M1 and the power supply line Vdd, and a second transistor M2, which is cascode-connected between the load inductor Ld and the first transistor M1. The gate of the second transistor M2 is connected to the ground with a capacitor Cg interposed therebetween. The rest of the configuration is as illustrated in the first embodiment.

According to the present embodiment, the second transistor M2 operates as a high impedance load circuit with respect to the first transistor M1, and the amplifier circuit 102 operates as a low-current-consumption and high-gain amplifier circuit.

The feedback circuit 1 is constituted by a series circuit and the switch SW, the series circuit including the resistors R11 and R12 and the capacitor C11, the switch SW bypassing the resistor R11. When the switch SW is OFF, the amount of feedback from the feedback circuit 1 is small and the feedback circuit 1 operates as a high gain amplifier circuit. When the switch SW is ON, the amount of feedback from the feedback circuit 1 is large and the feedback circuit 1 operates as a high linearity amplifier circuit.

Figure 4:
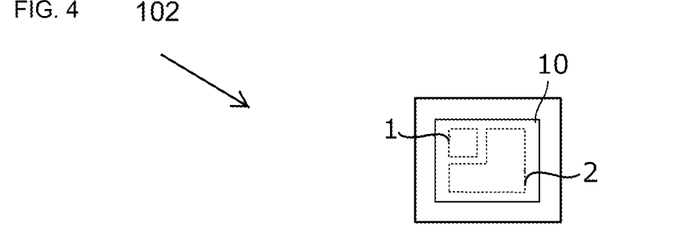
FIG. 4 is a plan view of the structure inside the chip of the amplifier circuit 102.

FIG. 4 is a plan view of the structure inside the chip of the amplifier circuit 102. A die 10 is provided inside the chip. The feedback circuit 1 illustrated in FIG. 3 and the other portion (the main portion of the amplifier circuit 102) 2 are configured on this die 10.

In this manner, an amplifier circuit with a feedback circuit is completed on a single die by forming the feedback circuit 1 together with, for example, the first transistor M1 and the second transistor M2 on the single die, and thus the amplifier circuit can be miniaturized.

Third Embodiment

In a third embodiment, an example of an amplifier circuit is illustrated in which a connection path of the feedback circuit differs from that illustrated in the second embodiment.

Figure 5:
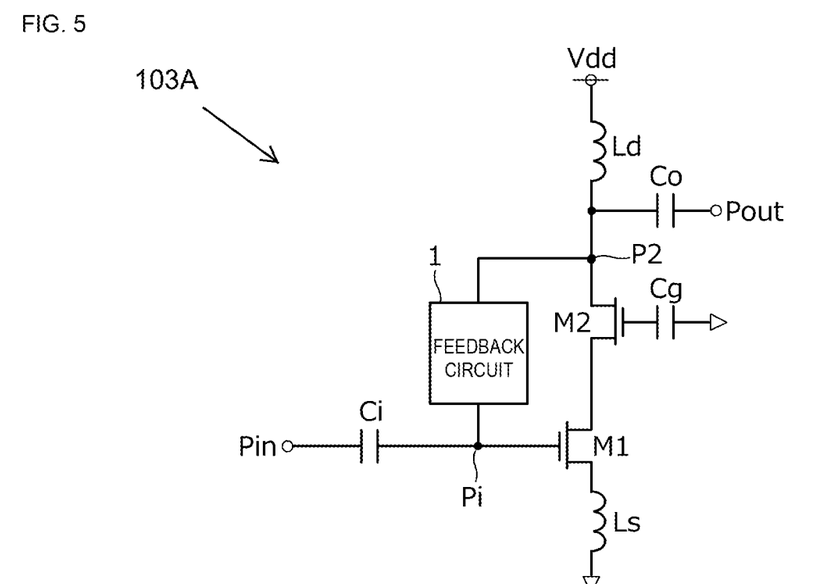
FIG. 5 is a circuit diagram of an amplifier circuit 103A according to a third embodiment.

FIG. 5 is a circuit diagram of an amplifier circuit 103A according to the third embodiment. This amplifier circuit 103A is a cascode amplifier circuit including the first transistor M1, which includes the signal input portion Pi into which a signal is input from the outside, the load inductor Ld, which is connected between this first transistor M1 and the power supply line Vdd, and the second transistor M2, which is cascode-connected between the load inductor Ld and the first transistor M1. The gate of the second transistor M2 is connected to the ground with the capacitor Cg interposed therebetween.

The inductor (feedback inductor) Ls is connected between the source of the first transistor M1 and the ground.

The feedback circuit 1 is connected between a connection portion P2 (the drain of the second transistor M2) between the load inductor Ld and the second transistor M2 and the signal input portion Pi of the first transistor M1 (the gate of the first transistor M1).

The capacitor Ci is connected between a signal input end Pin of the amplifier circuit 103A and the gate of the first transistor M1. In addition, the capacitor Co is connected between a signal output end Pout of the amplifier circuit 103A and the connection portion P2.

In this manner, one end of the feedback circuit 1 may be connected to a connection point between the load inductor Ld and the second transistor M2.

Figure 6:
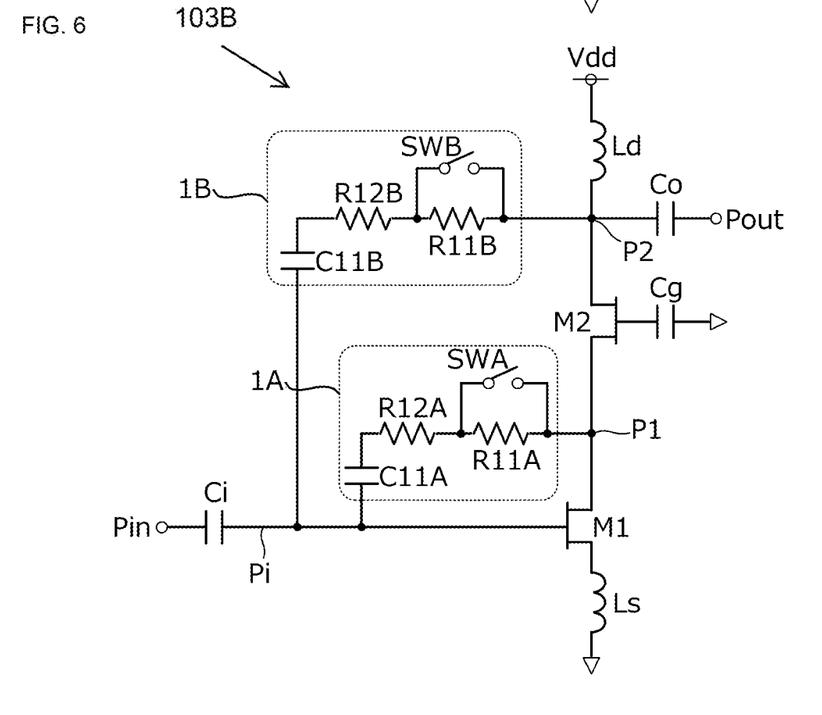
FIG. 6 is a circuit diagram of another amplifier circuit 103B according to the third embodiment.

FIG. 6 is a circuit diagram of another amplifier circuit 103B according to the present embodiment. This amplifier circuit 103B includes two feedback circuits, which are feedback circuits 1A and 1B. The feedback circuit 1A is connected between a connection portion P1 (the drain of the first transistor M1) between the first transistor M1 and the second transistor M2 and the signal input portion Pi of the first transistor M1 (the gate of the first transistor M1). The feedback circuit 1B is connected between the connection portion P2 (the drain of the second transistor M2) between the load inductor Ld and the second transistor M2 and the signal input portion Pi of the first transistor M1 (the gate of the first transistor M1).

The feedback circuit 1A is constituted by resistors R11A and R12A, a capacitor C11A, and a switch SWA. Likewise, the feedback circuit 1B is constituted by resistors R11B and R12B, a capacitor C11B, and a switch SWB.

Figure 7:
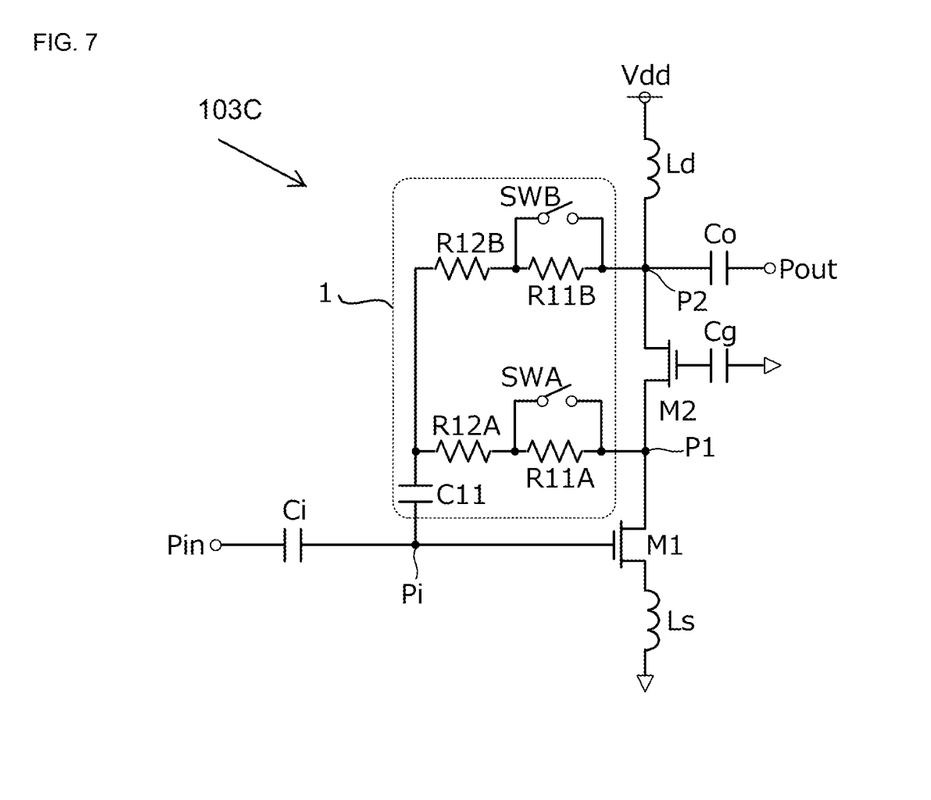
FIG. 7 is a circuit diagram of still another amplifier circuit 103C according to the third embodiment.

FIG. 7 is a circuit diagram of still another amplifier circuit 103C according to the present embodiment. The feedback circuit 1 of this amplifier circuit 103C is constituted by the resistors R11A, R12A, R11B, and R12B, the capacitor C11, and the switches SWA and SWB. The capacitor C11 corresponds to the capacitors C11A and C11B illustrated in FIG. 6 (the capacitor C11 serving as two capacitors). The rest of the configuration is as illustrated in FIG. 6.

As illustrated in FIGS. 6 and 7, there may be provided a feedback circuit or feedback circuits between a plurality of positions (P1 and P2) between the load inductor Ld and the first transistor M1 and the signal input portion Pi. High gain and high linearity can be obtained also from this configuration. In addition, the degree of linearity can be adjusted by selectively establishing connection in the feedback circuit or circuits. For example, the degree of linearity can be adjusted stepwise.

Fourth Embodiment

In a fourth embodiment, an amplifier circuit is illustrated that obtains a predetermined gain and a predetermined degree of linearity through control of a first transistor.

Figure 8:
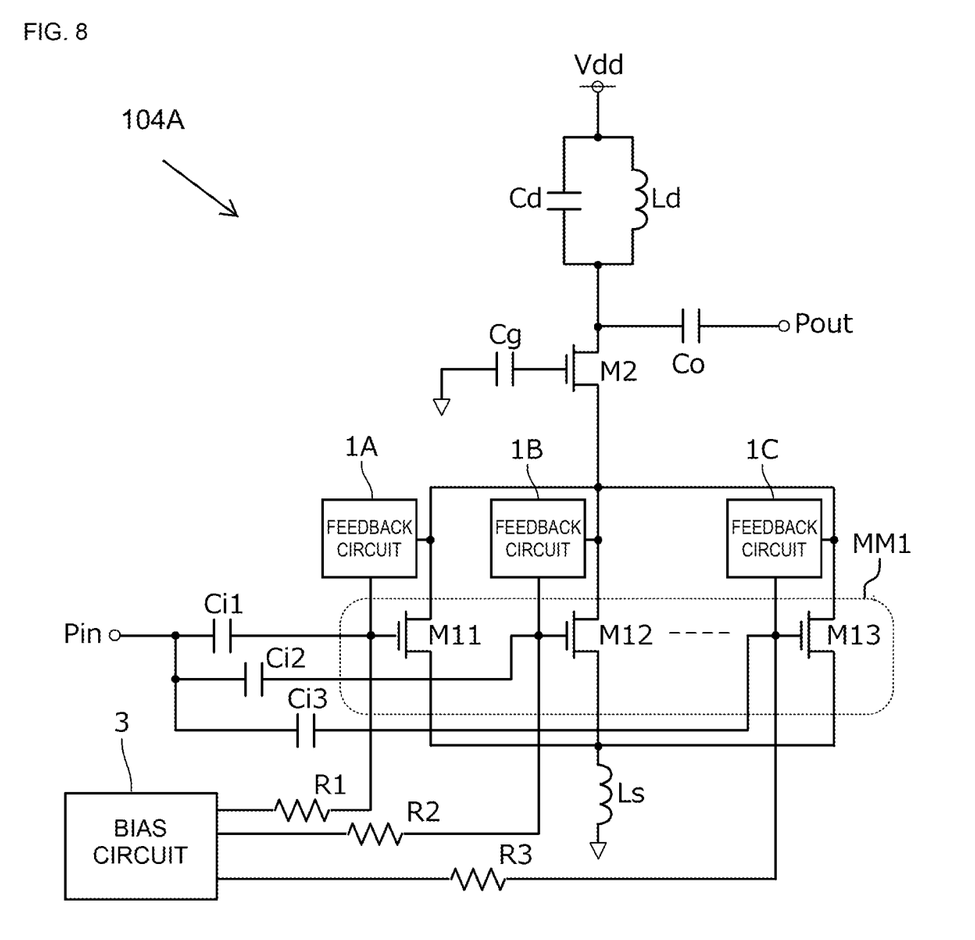
FIG. 8 is a circuit diagram of an amplifier circuit 104A according to a fourth embodiment.

FIG. 8 is a circuit diagram of an amplifier circuit 104A according to the fourth embodiment. This amplifier circuit 104A is a cascode amplifier circuit including a first transistor circuit MM1, a load circuit, and the second transistor M2. The first transistor circuit MM1 receives a signal from the outside, the load circuit is a parallel circuit including the load inductor Ld and a capacitor Cd and is connected between this first transistor circuit MM1 and the power supply line Vdd, and the second transistor M2 is cascode-connected between this load circuit and the first transistor circuit MM1. The gate of the second transistor M2 is connected to the ground with the capacitor Cg interposed therebetween.

The inductor (feedback inductor) Ls is connected between the source of the first transistor circuit MM1 and the ground.

The first transistor circuit MM1 is constituted by a plurality of transistors M11, M12, . . . , and M13, which are connected in parallel. The gates of the transistors M11, M12, and M13 are connected to the signal input end Pin with respective capacitors Ci1, Ci2, and Ci3 interposed therebetween. In addition, the feedback circuit 1A is connected between the drain and gate of the transistor M11, the feedback circuit 1B is connected between the drain and gate of the transistor M12, and a feedback circuit 1C is connected between the drain and gate of the transistor M13.

In addition, the gates of the transistors M11, M12, and M13 are connected to a bias circuit 3 with respective resistors R1, R2, and R3 interposed therebetween.

The bias circuit 3 applies a bias voltage to the gates of the transistors M11, M12, and M13 such that the transistors M11, M12, and M13 selectively enter an active state or an inactive state. For example, in a case where the transistors M11, M12, and M13 are n-channel enhancement-type MOSFETs, the transistors are made inactive by setting a gate voltage Vg to 0 and are made to enter the active state by applying a predetermined positive voltage to the gate. The transistor in the inactive state is in a cut-off state, and the drain-source of the transistor is substantially open.

Figure 9:
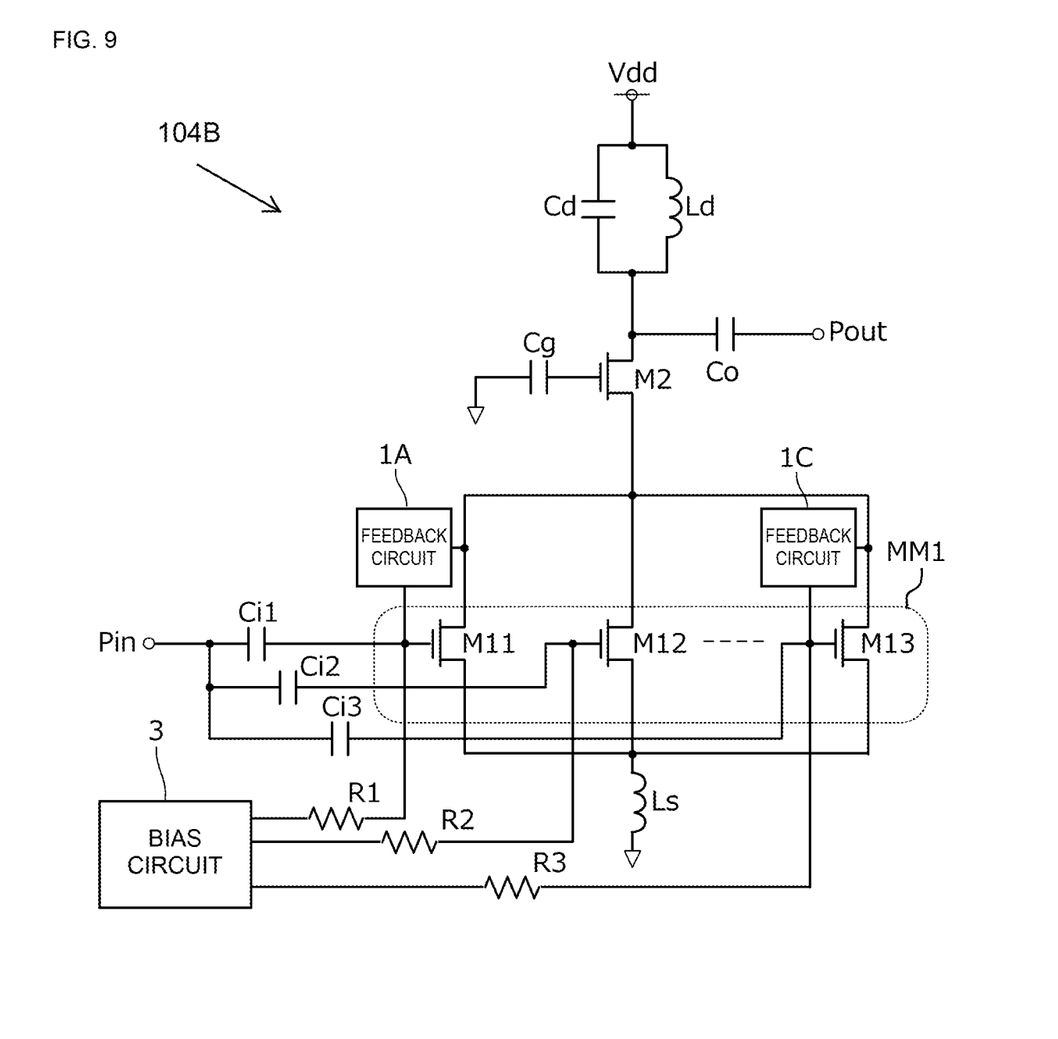
FIG. 9 is a circuit diagram of another amplifier circuit 104B according to the fourth embodiment.

FIG. 9 is a circuit diagram of another amplifier circuit 104B according to the fourth embodiment. The amplifier circuit 104B differs from the amplifier circuit 104A illustrated in FIG. 8 in terms of a feedback circuit connection configuration. The first transistor circuit MM1 of this amplifier circuit 104B includes a transistor to which no feedback circuit is connected. The rest of the configuration is as illustrated in FIG. 8.

In the example illustrated in FIG. 9, the feedback circuit 1A is connected between the drain and gate of the transistor M11, and the feedback circuit 1C is connected between the drain and gate of the transistor M13; however, no feedback circuit is connected between the drain and gate of the transistor M12. With this configuration, the degree of linearity can be adjusted (set) by selectively establishing connection in the feedback circuits. For example, the degree of linearity can be adjusted stepwise.

Due to the configurations illustrated in FIGS. 8 and 9, the number of transistors that are connected in parallel can be changed by selectively applying a bias voltage to the plurality of transistors M11, M12, . . . , M13. Consequently, the effective transistor size (equivalent size) of the first transistor circuit MM1 is changed, and thus the gain and the degree of linearity can be determined. That is, in a case where an input signal is small and the gain is more necessary than the linearity (a gain-oriented case), the number of transistors operated among the plurality of transistors M11, M12, . . . , M13 is increased, and in a case where an input signal is large and the linearity is more necessary than the gain (a linearity-oriented case), the number of transistors operated among the plurality of transistors M11, M12, . . . , M13 is reduced.

Figure 10:
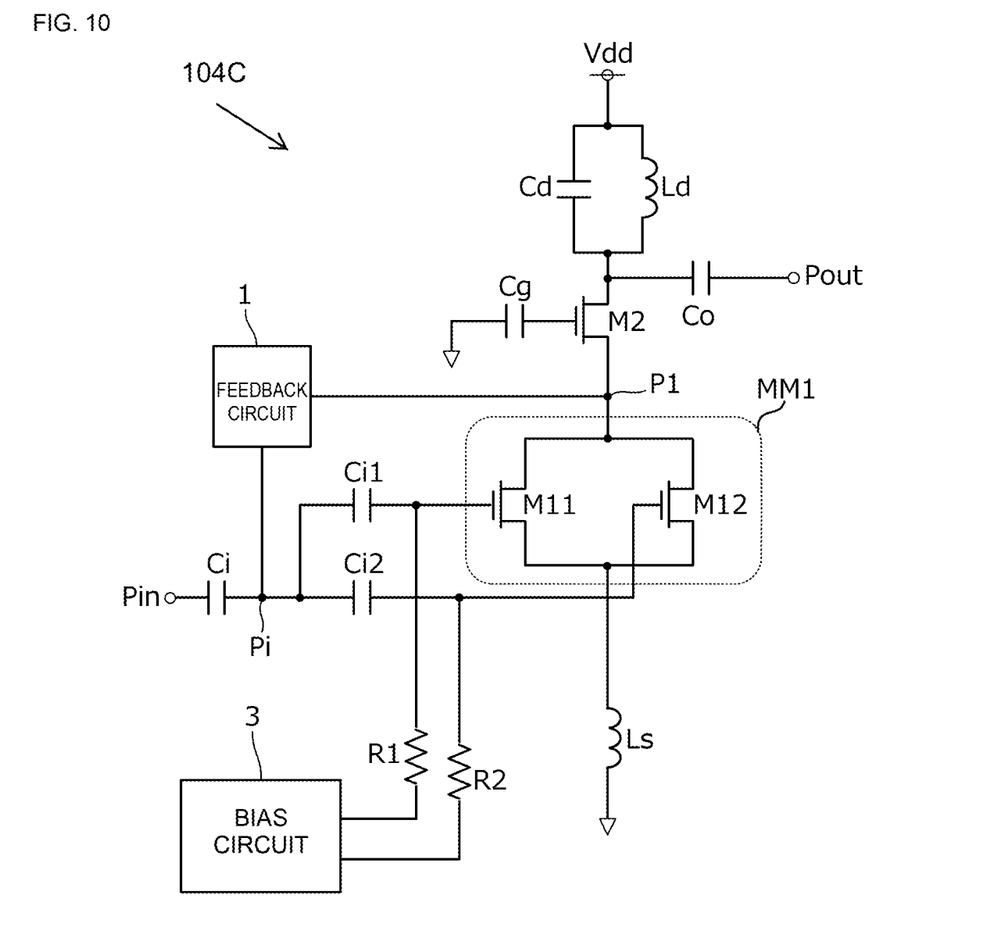
FIG. 10 is a circuit diagram of still another amplifier circuit 104C according to the fourth embodiment.

FIG. 10 is a circuit diagram of still another amplifier circuit 104C according to the fourth embodiment. The amplifier circuit 104C differs from the amplifier circuits 104A and 104B illustrated in FIGS. 8 and 9 in terms of the configuration of the first transistor circuit MM1 and a feedback circuit connection configuration.

In the amplifier circuit 104C of FIG. 10, the feedback circuit 1 is connected between the connection portion P1 between the first transistor circuit MM1 and the second transistor M2 and the signal input portion Pi of the first transistor circuit MM1. The gates of the transistors M11 and M12 are connected to the signal input portion Pi with the capacitors Ci1 and Ci2 interposed therebetween.

The first transistor circuit MM1 is constituted by the transistors M11 and M12, which have different gate widths. The gate width of the transistor M11 and that of the transistor M12 has a relationship of 1:2. The bias circuit 3 can set a bias voltage application state of the transistors M11 and M12 to any one of four states (two squared states) and can set an effective transistor size of the first transistor circuit MM1 to any one of four sizes (two squared sizes). Consequently, the effective size of the first transistor circuit MM1 can be set in a multilevel manner even with a small number of transistors, and setting ranges for the gain and linearity characteristics can be easily increased. That is, in a case where an input signal is small and the gain is more necessary than the linearity, the effective size of the first transistor circuit MM1 is increased, and in a case where an input signal is large and the linearity is more necessary than the gain, the effective size of the first transistor circuit MM1 is reduced.

Note that the first transistor circuit MM1 may also be constituted by three transistors or more. In that case, if the gate widths have a relationship of $2^0:2^1:2^2:2^3: \ldots$, that is, the ratio between the gate widths is set using powers of two, the effective transistor size of the first transistor circuit MM1 can be set in a more multilevel manner with a small number of transistors, and the setting ranges for the gain and linearity characteristics can be easily increased.

According to the present embodiment, a predetermined gain and a predetermined degree of linearity are obtained by controlling not only the amount of feedback from the feedback circuit 1 but also the effective transistor size (effective gate width) of the first transistor circuit MM1. In addition, the gain and linearity setting ranges can be increased by combining control of the amount of feedback and control of the transistor size.

In the examples illustrated in FIGS. 8, 9, and 10, the amplifier circuits are configured so as to control the gate bias voltages of the plurality of transistors constituting the first transistor circuit MM1; however, the circuits may also be configured such that certain transistors among the plurality of transistors are selectively connected in parallel using a switch.

Note that in the second to fourth embodiments, the cascode amplifier circuits including one cascode-connected second transistor M2 are illustrated as examples; however, the second transistor M2 may also be constituted by a plurality of transistors that are connected in series. In addition, in this case, a feedback circuit may be connected between a connection point between second transistors among the plurality of second transistors and the signal input portion Pi of the first transistor circuit MM1. In a case where the second transistors are a plurality of transistors connected in series, it is possible to adjust the output impedance. Thus, it is easier to achieve impedance matching with a subsequent circuit. In addition, it is possible to adjust the current consumption.

Lastly, all aspects of the embodiments above are examples and not limitations. Modifications and changes can be made as appropriate by those skilled in the art. The scope of the present disclosure is not indicated by the embodiments described above but by the claims. Furthermore, the scope of the present disclosure includes changes from embodiments that fall within a scope equivalent to the scope of the claims.

REFERENCE SIGNS LIST

C11, C11A, C11B, C12, C13 capacitor
Cg capacitor
Ci, Ci1, Ci2, Ci3 capacitor
Co capacitor
Ld load inductor
Ls inductor
M1 first transistor
MM1 first transistor circuit
M11, M12, M13 transistor
M2 second transistor
P1, P2 connection portion
Pi signal input portion
Pin signal input end
Po connection portion
Pout signal output end
R1, R2, R3 resistor
R11, R12, R13 resistor
R11A, R12A, R11B, R12B resistor
SW, SW1, SW2, SW3 switch
SWA, SWB switch
Vdd power supply line
1, 1A, 1B, 1C feedback circuit
2 amplifier circuit main portion
3 bias circuit
10 die
101, 102, 103A, 103B, 103C, 104A, 104B, 104C amplifier circuit

The invention claimed is:

1. An amplifier circuit comprising:
a plurality of first transistors, each of the plurality of first transistors having a respective input into which a signal is supplied, and the plurality of first transistors being connected in parallel;
a load circuit that is connected between the plurality of first transistors and a power supply line; and
a plurality of feedback circuits that are each connected at a first common node between the load circuit and the plurality of first transistors, and at a second respective node to each input of the plurality of first transistors, each of the plurality of feedback circuits being connected to a different one of the plurality of first transistors,
wherein each of the feedback circuits has a variable impedance and comprises a plurality of passive elements connected in series and at least one switch configured to selectively connect at least one of the plurality of passive elements, the plurality of passive elements comprising a resistor, a capacitor, or an inductor, the at least one switch being connected in parallel to at least one of the plurality of passive elements connected in series, and
wherein the at least one switch is configured to be controlled according to a predetermined gain of the amplifier circuit and a predetermined degree of linearity of the amplifier circuit.

2. The amplifier circuit according to claim 1, wherein the each of the feedback circuits comprises a plurality of switches.

3. The amplifier circuit according to claim 1, further comprising: at least one second transistor cascode-connected between the load circuit and the plurality of first transistors.

4. The amplifier circuit according to claim 2, further comprising: at least one second transistor cascode-connected between the load circuit and the plurality of first transistors.

5. The amplifier circuit according to claim 3, wherein the plurality of feedback circuits, the plurality of first transistors, and the at least one second transistor are constituted on a single die.

6. The amplifier circuit according to claim 4, wherein the plurality of feedback circuits, the plurality of first transistors, and the at least one second transistor are constituted on a single die.

7. The amplifier circuit according to claim 1, wherein the plurality of feedback circuits are connected at a plurality of nodes between the load circuit and the plurality of first transistors.

8. The amplifier circuit according to claim 2, wherein the plurality of feedback circuits are connected at a plurality of nodes between the load circuit and the plurality of first transistors.

9. The amplifier circuit according to claim 3, wherein the plurality of feedback circuits are connected at a plurality of nodes between the load circuit and the plurality of first transistors.

10. The amplifier circuit according to claim 5, wherein the plurality of feedback circuits are connected at a plurality of nodes between the load circuit and the plurality of first transistors.

11. The amplifier circuit according to claim 1, wherein at least one of the plurality of first transistors is not connected to one of the plurality of feedback circuits.

12. The amplifier circuit according to claim 1, further comprising:
a bias circuit configured to selectively supply a bias voltage to the plurality of first transistors.

13. The amplifier circuit according to claim 11, further comprising:
a bias circuit configured to selectively supply a bias voltage to the plurality of first transistors.

14. The amplifier circuit according to claim 1, wherein the plurality of first transistors have different gate widths.

15. The amplifier circuit according to claim 11, wherein the plurality of first transistors have different gate widths.

16. The amplifier circuit according to claim 12, wherein the plurality of first transistors have different gate widths.

* * * * *